(12) United States Patent
Lin et al.

(10) Patent No.: US 10,157,757 B2
(45) Date of Patent: Dec. 18, 2018

(54) GAS-CONTROLLED BONDING PLATFORM FOR EDGE DEFECT REDUCTION DURING WAFER BONDING

(71) Applicant: International Business Machines Corporation, Armonk, NY (US)

(72) Inventors: Wei Lin, Albany, NY (US); Spyridon Skordas, Troy, NY (US); Robert R. Young, Jr., Poestenkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/822,578

(22) Filed: Nov. 27, 2017

(65) Prior Publication Data

US 2018/0082864 A1  Mar. 22, 2018

Related U.S. Application Data

(62) Division of application No. 14/269,457, filed on May 5, 2014, now Pat. No. 9,922,851.

(51) Int. Cl.
 B23K 20/02 (2006.01)
 H01L 21/67 (2006.01)
 H01L 23/00 (2006.01)

(52) U.S. Cl.
 CPC ........ H01L 21/67092 (2013.01); B23K 20/02 (2013.01); H01L 24/75 (2013.01);
 (Continued)

(58) Field of Classification Search
 CPC ....... H01L 21/67092; H01L 2224/8301; H01L 24/75; H01L 24/83; H01L 2924/37001; B23K 20/02
 See application file for complete search history.

(56) References Cited

U.S. PATENT DOCUMENTS 3,740,900 A   6/1973  Youmans et al.
4,818,323 A   4/1989  d'Aragona et al.
(Continued)

FOREIGN PATENT DOCUMENTS

TW      200837837 A1    9/2008

OTHER PUBLICATIONS

Castex et al.; "Mechanism of Edge Bonding Void Formation in Hydrophilic Direct Wafter Bonding"; ECS Solid State Letters; vol. 2 (6), pp. 47-50; 2013.
(Continued)

*Primary Examiner* — George R Koch
(74) *Attorney, Agent, or Firm* — Steven J. Meyers; Hoffman Warnick LLC

(57) ABSTRACT

A wafer bonding method includes placing a top wafer on a top bonding framework including a plurality of outlet holes around a periphery of the top bonding framework. A bottom wafer is placed on a bottom bonding framework that includes a plurality of inlet holes around a periphery of the bottom bonding framework. The top bonding framework is in overlapping relation to the bottom bonding framework such that a gap exist between the top wafer and the bottom wafer. A gas stream is circulated through the gap between the top wafer and the bottom wafer entering the gap through one or more of the plurality of inlet holes and exiting the gap through one or more of the plurality of outlet holes. The gas stream replaces any existing ambient moisture from the gap between the top wafer and the bottom wafer.

14 Claims, 11 Drawing Sheets

(52) U.S. Cl.
CPC ...... *H01L 24/83* (2013.01); *H01L 2224/8301* (2013.01); *H01L 2924/37001* (2013.01)

(56) References Cited

U.S. PATENT DOCUMENTS

| | | |
|---|---|---|
| 5,447,570 A | 9/1995 | Schmitz et al. |
| 5,545,283 A | 8/1996 | Collins et al. |
| 5,688,331 A | 11/1997 | Argua et al. |
| 5,895,558 A | 4/1999 | Spence |
| 6,413,874 B1 | 7/2002 | Sato |
| 6,716,289 B1 | 4/2004 | Sillmon |
| 7,060,945 B2 | 6/2006 | Kondou et al. |
| 8,158,013 B2 | 4/2012 | Kerdiles et al. |
| 8,333,842 B2 | 12/2012 | Lubomirsky et al. |
| 8,999,090 B2 | 4/2015 | Gaudin |
| 2011/0143529 A1 | 6/2011 | Lee |
| 2013/0026578 A1 | 1/2013 | Tsau et al. |
| 2013/0199730 A1 | 8/2013 | Gudeman |
| 2013/0327463 A1* | 12/2013 | Kitahara ........... H01L 21/67092 156/64 |
| 2014/0141560 A1 | 5/2014 | Maekawa |
| 2014/0174362 A1 | 6/2014 | Kao et al. |
| 2014/0349118 A1* | 11/2014 | Izumi ................ H01L 21/67092 428/411.1 |
| 2014/0378707 A1 | 12/2014 | Lee et al. |
| 2016/0087040 A1 | 3/2016 | Mao |

OTHER PUBLICATIONS

Eichler et al.; "Effects on Silanol Condensation during Low Temperature Silicon Fusion Bonding"; Journal of The Electrochemical Society; vol. 156 (10), H786-H793; 2009.
Non Final Office Action dated Aug. 17, 2017 for U.S. Appl. No. 14/269,457, filed May 5, 2014; 22 pages.
Notice of Allowance and Fee(s) Due dated Nov. 9, 2017 for U.S. Appl. No. 14/269,457, filed May 5, 2014; 23 pages.
Non Final Office Action dated Feb. 9, 2018 for U.S. Appl. No. 15/811,738, filed Nov. 14, 2017; 19 pages.
Notice of Allowance and Fee(s) Due dated Mar. 27, 2018 for U.S. Appl. No. 15/811,738, filed Nov. 14, 2017; 9 pages.

* cited by examiner

GAS-CONTROLLED BONDING PLATFORM FOR EDGE DEFECT REDUCTION DURING WAFER BONDING

This application is a division of U.S. application Ser. No. 14/269,457, filed on May 5, 2014, now issued as U.S. Pat. No. 9,922,851 B2.

BACKGROUND

The present invention generally relates to semiconductor manufacturing and more particularly to wafer bonding techniques as part of three-dimensional (3D) integration processes.

In a 3D integration process individual wafers may be stacked and joined into a single package in order to reduce space. A common technique used in wafer-scale 3D integration is wafer bonding. In a wafer bonding process, the electronic devices on one wafer may be aligned with the electronic devices on another wafer, and then the wafers may be bonded together using, for example, an oxide-oxide fusion bonding process.

SUMMARY

The ability to conduct wafer bonding processes with a reduced amount of defects formed in the bonded surface may facilitate advancing the capabilities of current wafer-scale 3D integration technology.

According to one embodiment of the present disclosure, a wafer bonding method may include placing a top wafer on a top bonding framework including a plurality of outlet holes around a periphery of the top bonding framework, placing a bottom wafer on a bottom bonding framework including a plurality of inlet holes around a periphery of the bottom bonding framework. The top bonding framework may be in overlapping relation to the bottom bonding framework such that a gap may exist between the top wafer and the bottom wafer. A gas stream may be circulated through the gap between the top wafer and the bottom wafer. The gas stream may enter the gap through one or more of the plurality of inlet holes and may exit the gap through one or more of the plurality of outlet holes. The gas stream may replace any existing ambient moisture from the gap between the top wafer and the bottom wafer.

According to another embodiment of the present disclosure, a wafer bonding method may include placing a top wafer on a top bonding framework including a first plurality of outlet holes and a second plurality of outlet holes around a periphery of the top bonding framework, placing a bottom wafer on a bottom bonding framework including a plurality of inlet holes around a periphery of the bottom bonding framework. The top bonding framework may be in overlapping relation to the bottom bonding framework such that a gap may exist between the top wafer and the bottom wafer. A flow control device may be added to the first plurality of outlet holes to monitor flow conditions of a gas stream and to block the first plurality of outlet holes. A pumping device may be added to a second plurality of outlet holes to prevent back diffusion of moisture into the gap between the top wafer and the bottom wafer. The gas stream may be circulated through the gap between the top wafer and the bottom wafer. The gas stream may enter the gap through one or more of the plurality of inlet holes and may exit the gap through one of more of the second plurality of outlet holes. The gas stream may replace any existing ambient moisture from the gap between the top wafer and the bottom wafer.

According to another embodiment of the present disclosure, a wafer bonding structure may include a top wafer on a top bonding framework of a top platform, the top bonding framework may include a first plurality of outlet holes and a second plurality of outlet holes around a periphery of the top bonding framework, and a bottom wafer on a bottom bonding framework of a bottom platform. The bottom bonding framework may include a plurality of ii holes around a periphery of the bottom bonding framework. The top platform may be in an overlapping relation to the bottom platform.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
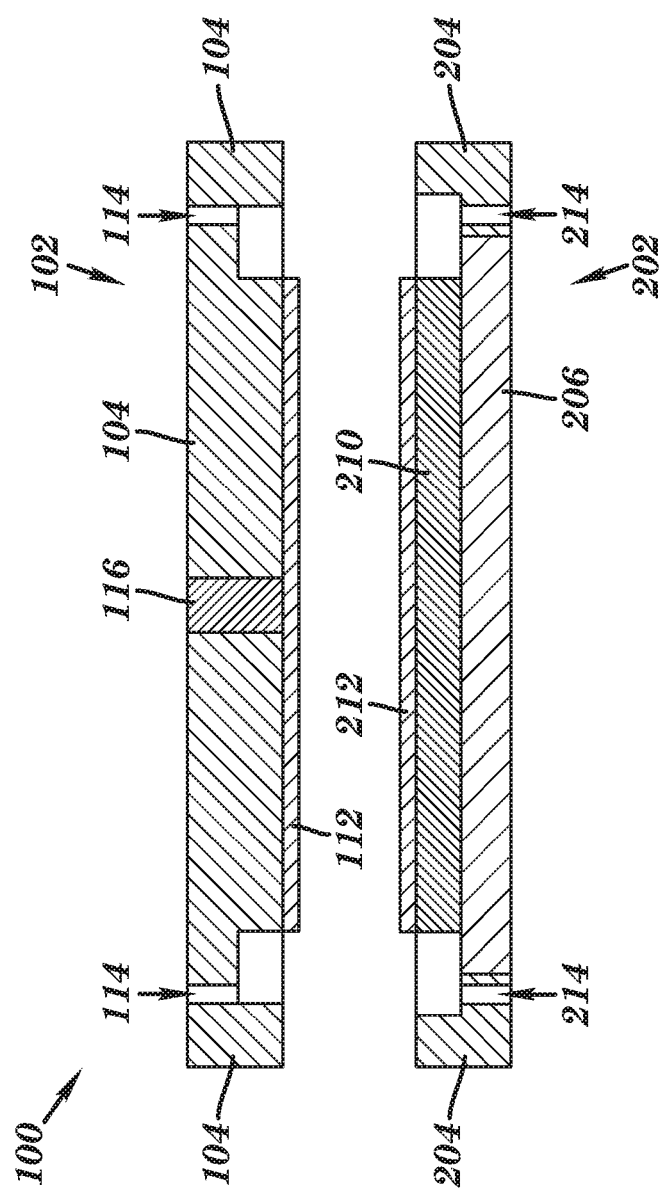
FIG. 1 is a cross-sectional view of a wafer bonding structure, according to an embodiment of the present invention.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail, in other instances, some processing steps or operations that are known in the art may not be described at all. It should be understood that the following description is rather focused on the distinctive features or elements of various embodiments of the present invention.

In wafer-scale 3D integration technology, voids and other defects may form on or in the wafer surface during the wafer bonding process. The voids or defects may include unbonded areas between the joined wafers. Various atmospheric and operational conditions may cause these voids to form during the wafer bonding process. Since voids may negatively impact device functionality, the presence of these un-bonded areas between the wafers may affect reliability and yield. Poor reliability and yield may affect performance and cost, respectively.

Voids may form particularly on a periphery of the wafer during, for example, an oxide-oxide low-temperature fusion bonding process. The formation of voids may be caused by the condensation of pre-existing moisture in a gap located between the wafers to be bonded. The moisture present in this gap may generally come from the atmospheric humidity existent within the semiconductor fabrication plant.

The present invention generally relates to semiconductor manufacturing and more particularly to wafer bonding techniques as part of three-dimensional (3D) integration processes. Moisture between the two wafers may be purged during bonding to produce a void free bond between the two wafers. One way to purge the moisture from between the two wafers may include purging the bonding tool with a gas. One way to purge the bonding tool with the gas is described in detail below by referring to the accompanying drawings FIGS. 1-7.

Figure 1A:
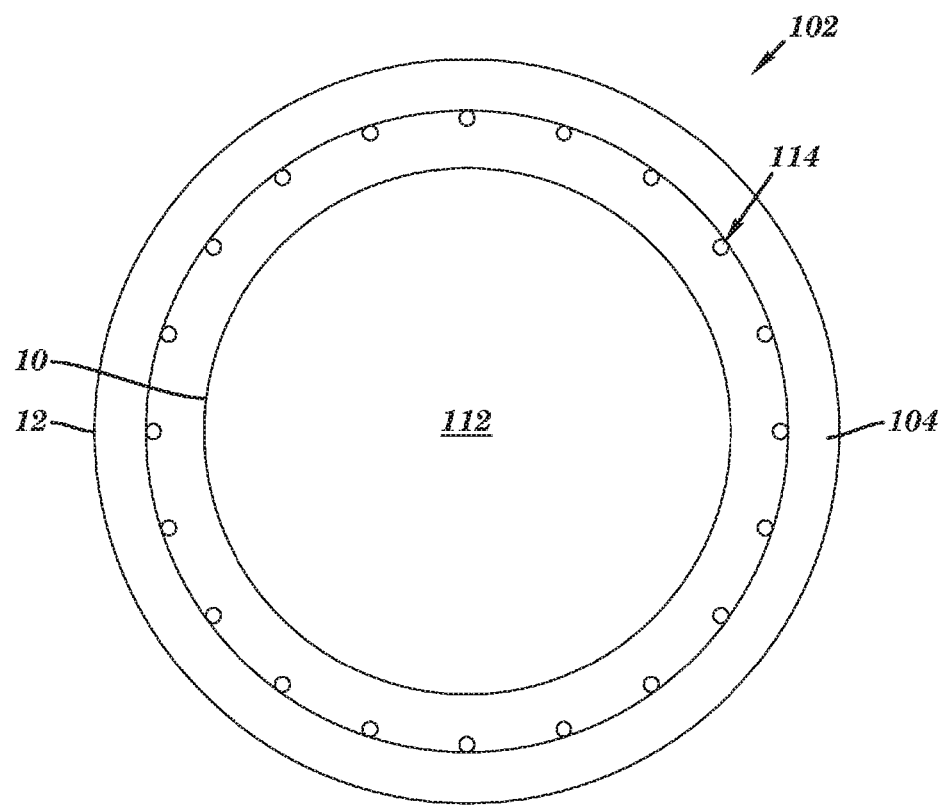
FIG. 1A is a bottom view of a top platform of the wafer bonding structure, according to FIG. 1.
Figure 1B:
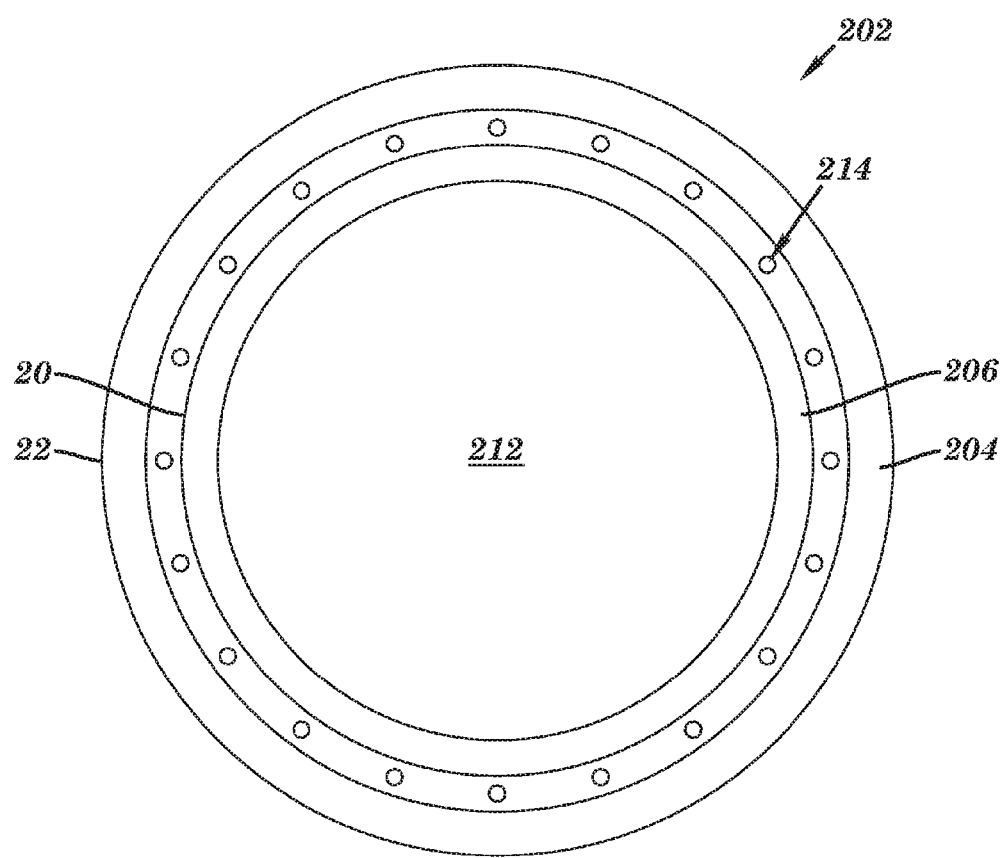
FIG. 1B is a top view of a bottom platform of the wafer bonding structure, according to FIG. 1.

Referring now to FIGS. 1, 1A and 1B, a bonding structure 100 is shown. The bonding structure 100 may include a top platform 102 and a bottom platform 202. FIG. 1A is a bottom view of the top platform 102 in FIG. 1 and FIG. 1B is a top view of the bottom platform 202 in FIG. 1. The bonding structure 100 may alternatively be referred to as a bonding tool.

The top platform 102 may include a top bonding framework 104 configured to hold or carry a top wafer 112. The top bonding framework 104 may further include a pin structure 116 located at or near a center of the top bonding framework 104. In addition, the top bonding framework 104 may also include a plurality of outlet holes 114 (hereinafter "outlet holes"). The outlet holes 114 may be arranged near a perimeter 12 of the top bonding framework 104. In some embodiments, the outlet holes 114 may be uniformly distributed between the perimeter 12 of the top bonding framework 104 and a perimeter 10 of the top wafer 112. The outlet holes 114 may be spaced apart from each other by a distance ranging from of approximately 5 mm to approximately 50 mm.

In the present embodiment, the bottom platform 202 may include a bottom bonding framework 204, a bottom stage 206, and a bottom bonding chuck 210. In general, the bottom stage 206 may be recessed within an opening in a center of the bottom bonding framework 204. Stated differently, the bottom bonding framework 204 may generally have a ring shape which surrounds the bottom stage 206. Also, the bottom stage 206 may be movable in a vertical direction with respect to the bottom bonding framework 204. The bottom bonding chuck 210 may be located on top of the bottom stage 206 to carry a bottom wafer 212. The bottom bonding chuck 210 may be configured to hold or carry the bottom wafer 212.

Similar to the top bonding framework 104 described above, the bottom bonding framework 204 may include a plurality of inlet holes 214 (hereinafter "inlet holes"). The inlet holes 214 may be arranged near a perimeter 22 of the bottom bonding framework 204. In some embodiments, the inlet holes 214 may be uniformly distributed between a perimeter 20 of the bottom stage 206 and the perimeter 22 of the bottom bonding framework 204. The inlet holes 214 may be spaced apart from each other in a similar fashion to the outlet holes 114 described above.

In general, the top platform 102 may be positioned above the bottom platform 202, as illustrated. It should be noted that the relative position of the top platform 102 and the bottom platform 202 is merely one example and that other configurations may be considered and are expressly contemplated. Furthermore, the top platform 102 may further include a configuration similar to the bottom bonding platform 202, and vice versa.

With continued reference to FIG. 1, the bonding structure 100 may be used to bond or join the top wafer 112 to the bottom wafer 212. During a wafer bonding process using a structure similar to the bonding structure 100, the top wafer 112 and the bottom wafer 212 may be brought into close physical contact with one another without the presence of any adhesion materials. The two wafers (112, 212) may each have a hydrophilic surface with a substantially high density of OH$^-$ groups attached to the surface.

First, the top wafer 112 may be positioned in and held by the top platform 102, and the bottom wafer 212 may be positioned in and held by the bottom platform 202. Each of the top and bottom platforms 102, 104 may use any known system to hold the wafers 112, 212, such as, for example, a pneumatic system which may create a vacuum to hold each of the wafers 112, 212. In general, the bonding process may commence by bringing either of the wafers (112, 212) within a predetermine distance from the other such that a gap remains. Next, the pin structure 116 of the top bonding platform 102 may rapidly force a center portion of the top wafer 112 to contact the bottom wafer 212. As the top wafer 112 releases from the top platform 102, contact between the two wafers (112, 212) may continue to propagate from the center outwards towards the wafers edge. The progression of the contact between the top wafer 112 and the bottom wafer 212 may be referred to as a bonding wave.

Referring now to FIGS. 2-7, exemplary process steps of bonding the top wafer 112 to the bottom wafer 212 using the boding structure 100 in accordance with one embodiment of the present invention are shown.

Since cross-sectional views of the top platform 102 (FIG. 1A) and the bottom platform 202 (FIG. 1B) will be used to describe the processing steps, it should be understood that although only two outlet holes 114 and only two inlet holes 214 are shown, the following processing steps may equally apply to more than two outlet holes and more than two inlet holes.

Figure 2:
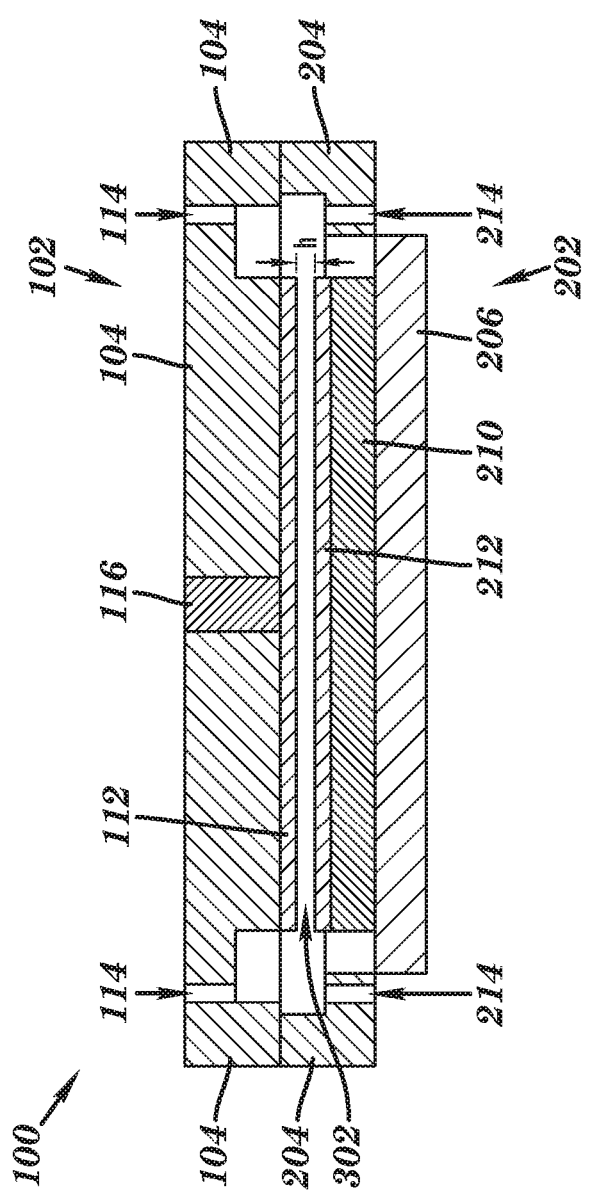
FIG. 2 is a cross-sectional view of the wafer bonding structure depicting bringing the top platform and the bottom platform into contact, according to an embodiment of the present invention.

Referring now to FIG. 2, an initial alignment step may be performed between the top platform 102 and the bottom platform 202. In this initial step, electronic devices (not shown) on the top wafer 112 may be aligned with electronic devices (not shown) on the bottom wafer 212. After aligning the top platform 102 and the bottom platform 202, either of the top platform 102 or the bottom platform 202 may move toward the other until they contact each other. Next, the bottom stage 206 may move within the bottom platform 202 bringing the bottom wafer 212 within a predetermined distance from the top wafer 112, such that a wafer-wafer gap 302 (hereinafter "gap") remains between the two wafers (112, 212).

The gap 302 may have a height h ranging from approximately 0.01 mm to approximately 10 mm. In one embodiment, the height h of the gap 302 may vary between approximately 0.05 mm to approximately 0.3 mm.

Figure 3:
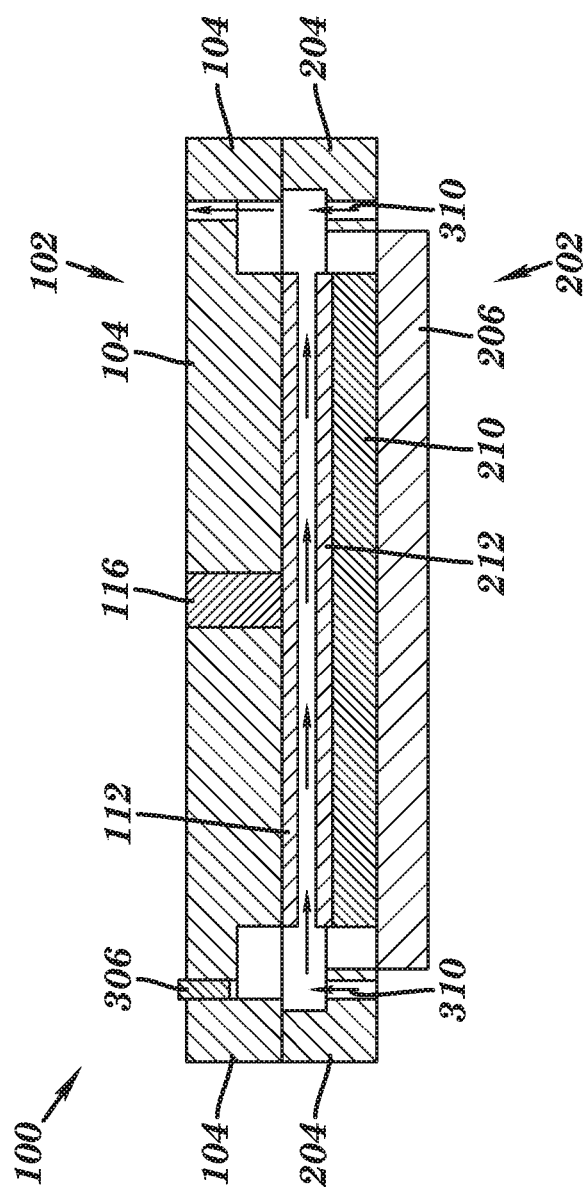
FIG. 3 is a cross-sectional view of the wafer bonding structure depicting purging moisture between two wafers by introducing a gas stream, according to an embodiment of the present invention.
Figure 3A:
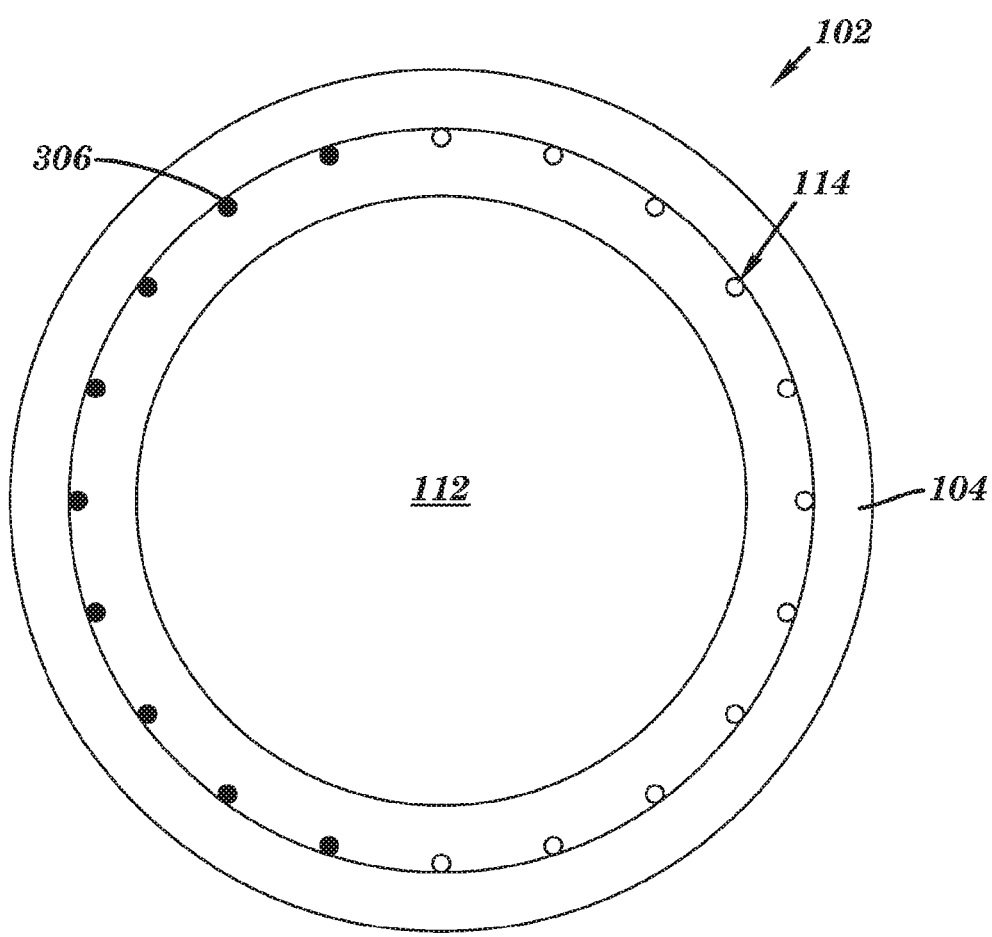
FIG. 3A is a bottom view of the top platform of the wafer bonding structure, according to FIG. 3.

Referring now to FIGS. 3 and 3A, a gas stream 310 may be introduced into the bonding structure 100 to purge excess moisture from between the top and bottom wafers 112, 212. The gas stream 310 may be used to purge any ambient moisture from the bonding structure 100 in an effort to create a void free bond between the wafers (112, 212), as mentioned above. More specifically, the gas stream 310 may be supplied to the bonding structure 100 through the inlet holes 214 and exit the bonding structure 100 through the outlet holes 114. The gas stream 310 may be distributed into and out of the bonding structure 100 in any fashion as long as it flows across the wafers (112, 212) sufficiently to purge the gap 302 (FIG. 2) from any ambient moisture. As such, the gas stream 310 may be distributed through any number and/or combination of the inlet holes 214 and the outlet holes 114.

In one embodiment, the gap 302 (FIG. 2) may contain air having a relative humidity of approximately 30% at room conditions. The gas stream 310 may circulate through the gap 302 (FIG. 2) until any ambient moisture has been purged from the bonding structure 100. In one exemplary embodiment, the gas purging time may range from approximately 30 sec to approximately 300 sec.

The gas stream 310 may include any dehumidified gas suitable for purging any ambient moisture from the gap 302 (FIG. 2). In one embodiment, the gas stream 310 may include dehumidified air. In another embodiment, the gas stream 310 may include nitrogen, argon, hydrogen, helium, neon or a mixture thereof with a negative Joule-Thomson coefficient. Although gases with positive Joule-Thomson coefficients may also be considered.

In other embodiments, the gas stream 310 may include a pre-heated or hot dry gas. The use of a hot dry gas may ensure substantial moisture removal from the gap 302 (FIG. 2) prior to bonding the top wafer 112 to the bottom wafer 212. In embodiments where the outlet holes 114 may remain open, the hot dry gas may prevent back diffusion of moisture into the gap 302 (FIG. 2). In one exemplary embodiment, the hot dry gas may include dry nitrogen, argon, hydrogen, helium or a mixture thereof. The purging time for the hot dry gas may range from approximately 10 sec to approximately 300 sec.

In one embodiment, a flow control device 306 may be inserted into one or more of the outlet holes 114 of the top platform 102 to control the flow characteristics of the gas stream 310.

The flow control device 306 may effectively prevent the gas stream 310 from exiting any outlet hole 114 in which it is located. More specifically, because the flow control device 306 may block one or more of the outlet holes 114, the gas stream 310 may be directed towards other outlet holes 114 that remain unblocked. In one example, about half of the outlet holes 114 located on one side of the top bonding platform 102, may be blocked with a flow control device 306, as illustrated in FIG. 3A. Doing so may improve the flow characteristics of the gas stream 302 to maximize flow across the wafers (112, 212) and through the gap 302.

The flow control device 306 may include any suitable shutter or plug structure capable of preventing the gas stream 302 from exiting one or more outlet holes 114. In one embodiment, the flow control device 306 may be capable of monitoring properties such as, for example, pressure and flow rate of the gas stream 310. In such embodiments, the flow control devices 306 may include a flow meter and/or a pressure sensor.

Figure 4:
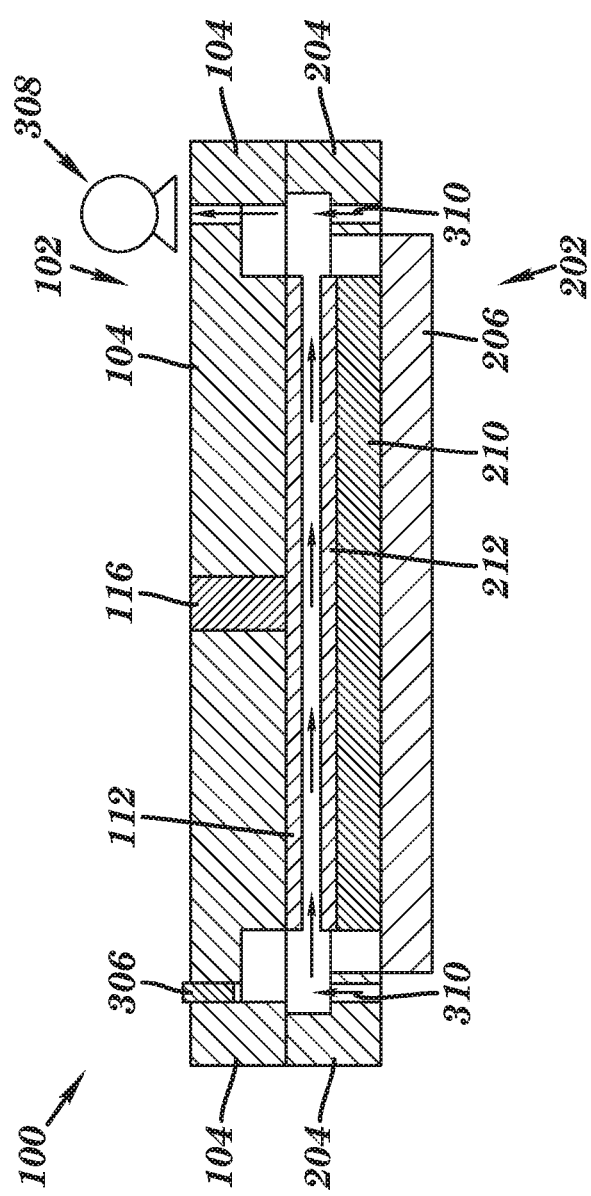
FIG. 4 is a cross-sectional view of the wafer bonding structure depicting adding a pumping device, according to an embodiment of the present invention.
Figure 4A:
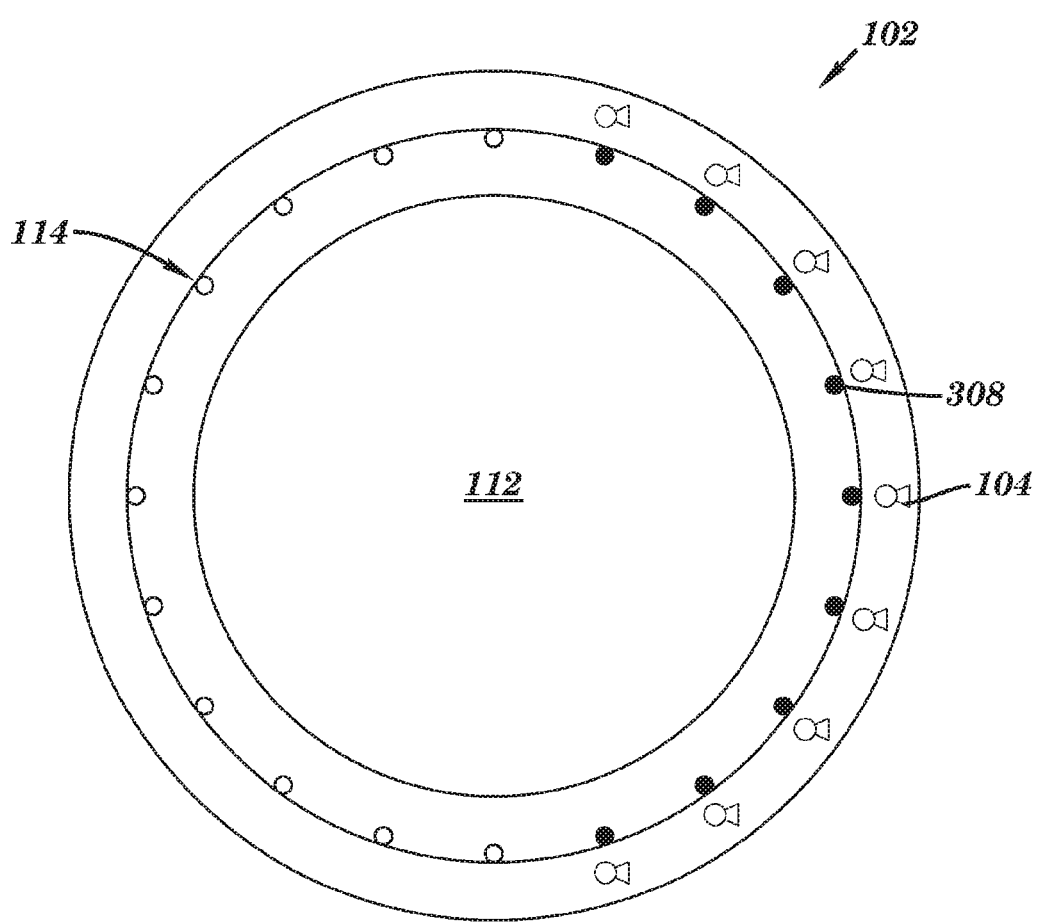
FIG. 4A is a bottom view of the top platform of the wafer bonding structure, according to FIG. 4.

Referring now to FIGS. 4 and 4A, and according to one embodiment of the present invention, a pumping device 308 may be coupled to one or more of the outlet holes 114 of the top platform 102 to control the flow characteristics of the gas stream 310. The pumping device 308 may be designed to lower the pressure at one or more of the outlet holes 114 and cause the gas stream 310 to flow towards the pumping device 308. In one example, a single pumping device (308) may be coupled to about half of the outlet holes 114 located on one side of the top boding platform 102 as illustrated in FIG. 4A. Doing so may result in a pressure differential between opposite sides of the gap 302 which may improve the flow characteristics of the gas stream 302 and maximize flow across the wafers (112, 212).

The pumping device 308 may include, for example, a multi stage diaphragm pump, a molecular drag pump, a molecular screw pump, and/or a standard roots and claw dry pump. In one exemplary embodiment, the pumping device 308 may include a dry multi-stage vacuum pump. In addition to improving the flow characteristics of the gas stream 302, the pumping device 308 may, among other things, reduce gas purging time, and prevent back diffusion of moisture into the gap 302 (FIG. 2) during the wafer bonding process.

It should be noted that the flow control device 306 and the pumping device 308 are mutually exclusive. More specifically, the flow control device 306 may be used without the pumping device 308 and vice versa, or they may be used in combination to achieve the desired flow characteristics of the gas stream 310. Furthermore, the configuration of inlet holes 214 (FIG. 2) and outlet holes 114 may preferably maximize the flow of the gas stream 310 across the gap 302. Therefore, the configuration of inlet holes 214 (FIG. 2) and outlet holes 114 as depicted in the figures is intended to illustrate one particular configuration or one embodiment; however alternative configurations which achieve the desired flow characteristics are expressly envisioned.

Figure 5:
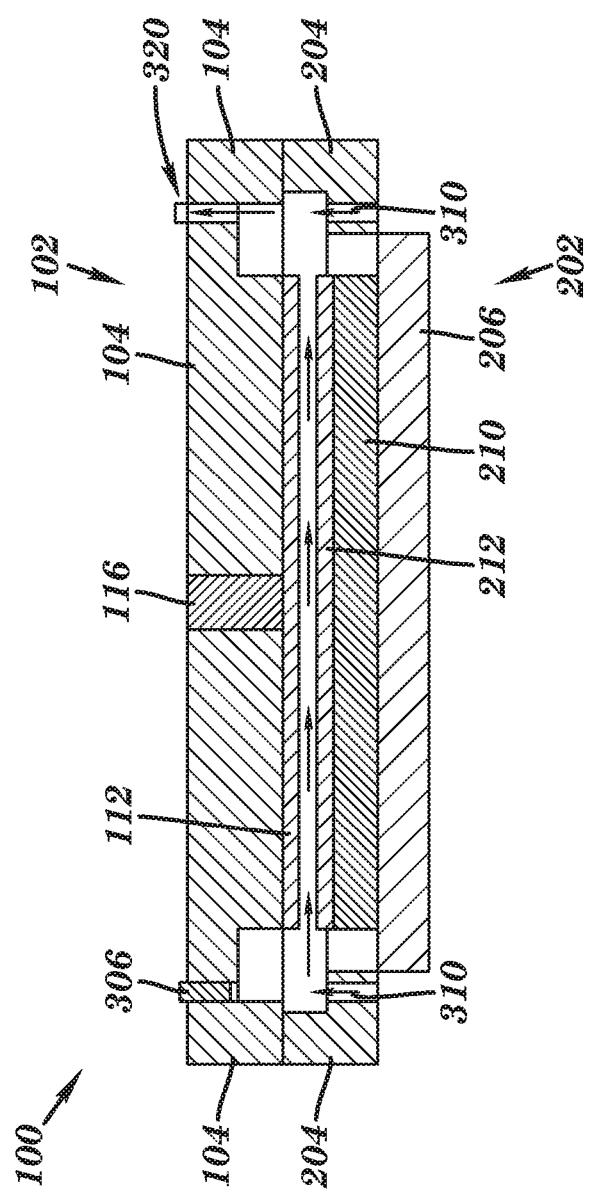
FIG. 5 is a cross-sectional view of the wafer bonding structure depicting adding a trapping region, according to an embodiment of the present invention.

Referring now to FIG. 5, a trapping region 320 may be positioned in or near the outlet holes 114 (FIG. 2), according to one embodiment of the present invention. The trapping region 320 may further enable control of the flow characteristic of the gas stream 310. More specifically, the trapping region 320 may further assist preventing back diffusion or back flow of the moisture removed from the gap 302 (FIG. 2) to the bonding area between the top wafer 112 and the bottom wafer 212. The trapping region 320 may be used with or without either or both of the flow control device 306 and the pumping device 308. In one exemplary embodiment, the trapping region 320 may include cryogenically cooled traps such as traps cooled by, for example, liquid nitrogen, and made of materials that may be easy to cool (i.e., metals) in order to promote the trapping of water molecules, hydrocarbon molecules, and the like.

Figure 6:
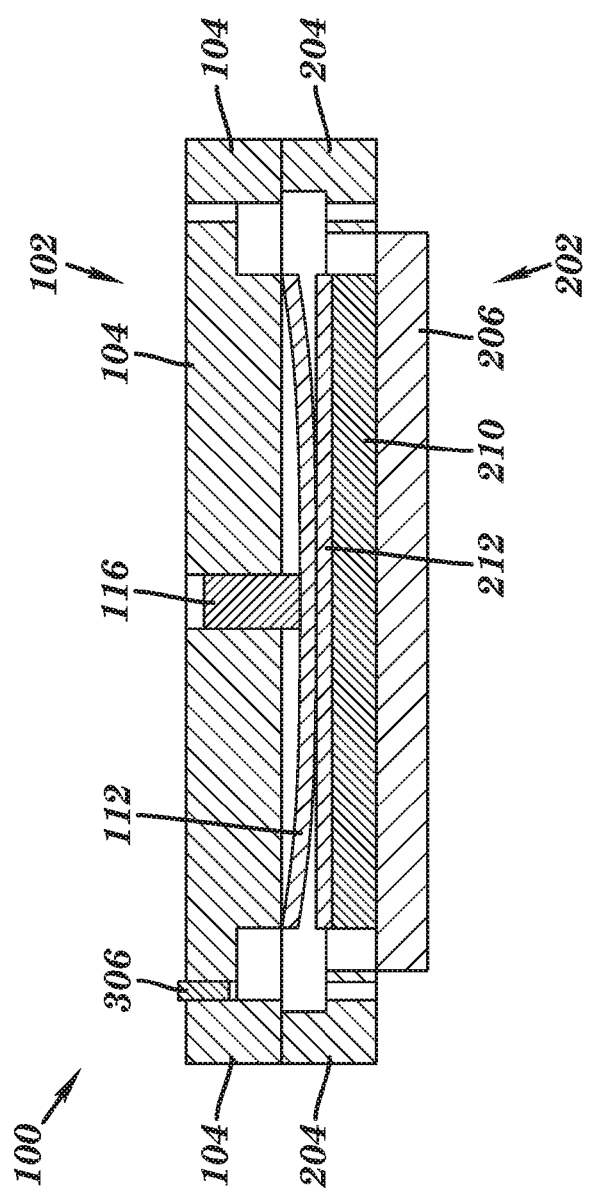
FIG. 6 is a cross-sectional view of the wafer bonding structure depicting pinning the top wafer to the bottom wafer, according to an embodiment of the present invention.

Referring now to FIG. 6, once the gas stream 310 (FIG. 3) has purged all or substantially all of the existing moisture of the gap 302 (FIG. 2), the bonding process may continue by reducing the amount of gas circulating within the gap 302 (FIG. 2). The flow rate of the gas stream 310 (FIG. 3) may be reduced to prevent misalignment between the wafers (112, 212) during the bonding process. It should be noted that the gas stream may continue to circulate at a reduced rate to prevent any backflow of moisture into the bonding structure 100, as mentioned above. The process continues by moving the bottom stage 206 within the bottom platform 202 to bring the bottom wafer 212 into contact with the top wafer 112.

In embodiment in which the pumping device 308 may be coupled to some of the outlet holes 114 (FIG. 4) of the top bonding framework 104, the gas stream 310 may be completely stopped and the pumping device 308 (FIG. 4) may be used to maintain a vacuum during bonding. Alternatively, the pumping device 308 (FIG. 4) may be used to apply a vacuum to the bonding structure 100 prior to bonding at which time all the inlet holes 214 and the outlet holes 114 may be sealed to maintain vacuum during bonding.

After bonding, the top wafer 112 may then be released and pinned to the bottom wafer 212 by means of the pin structure 116 to initiate the propagation of the bonding wave between the top wafer 112 and the bottom wafer 212. The bonding wave may rapidly propagate from the pinned area towards an edge region of the top wafer 112 and the bottom wafer 212. Formation of voids and other defects may be linked to the bonding wave propagation and to fluid dynamics between the wafers. A gas pressure drop may take place at the wafer edge described by a Joule-Thomson expansion. This adiabatic process may result in a gas temperature change which may lead to the condensation of small water droplets close to the wafer edge which may result in unbonded areas such as voids.

Figure 7:
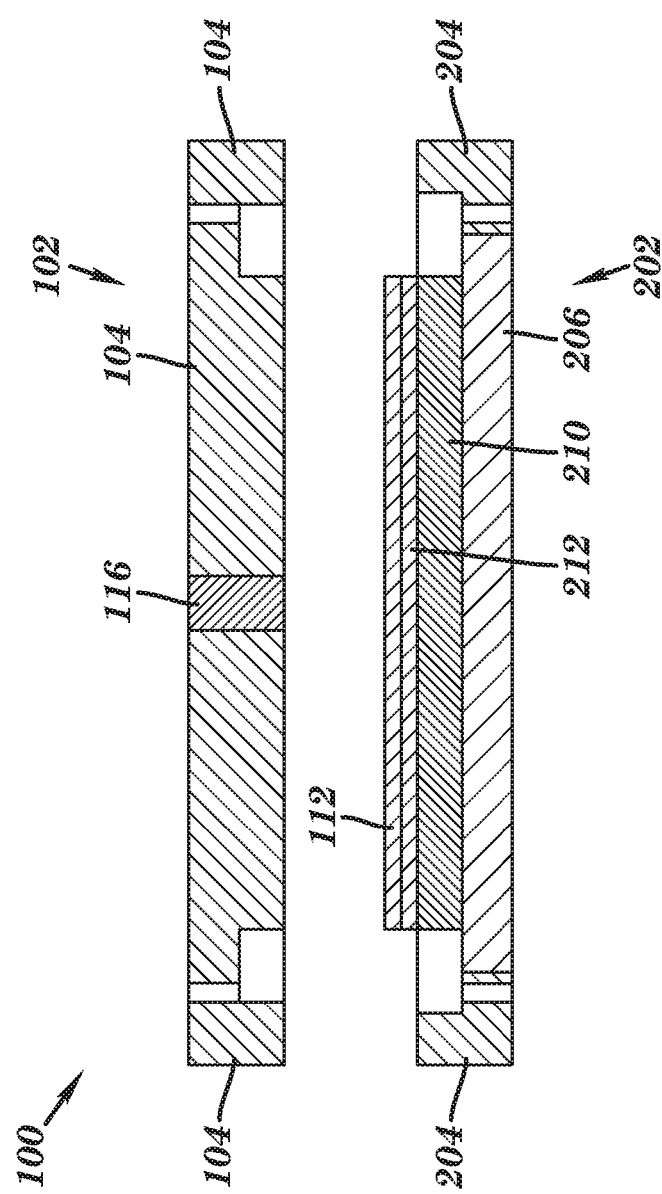
FIG. 7 is a cross-sectional view of the wafer bonding structure depicting separating the top platform from the bottom platform, according to an embodiment of the present invention.

Referring now to FIG. 7, once the top wafer 112 and the bottom wafer 212 are bonded together, the top bonding framework 104 and the bottom bonding framework 204 may return to their original positions.

Since void formation may be attributed to the condensation of moisture contained in the existing fluid within the gap 302 (FIG. 2), replacement of this fluid by a dehumidified gas may substantially reduce or eliminate any possible condensation of moisture occurring as a result of the adiabatic expansion that may take place during propagation of the bonding wave particularly in the edge region of the wafers.

Therefore, a wafer bonding structure that may allow for gas flow control between the top wafer 112 and the bottom wafer 212 may enhance moisture removal from the gap 302 before initiating the wafer bonding process thereby reducing the formation of voids particularly in the edge region of the wafers. Gas flow conditions may be adjusted to maximize moisture removal from the gap and to minimize gas consumption in the system which may potentially increase device reliability and reduce device manufacturing costs. The bonding structure 100 may also be compatible with other existing bonding alignment processes.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The invention claimed is:

1. A wafer bonding structure, the structure comprising:
   a top wafer on a top bonding framework of a top platform, the top bonding framework including a first plurality of outlet holes and a second plurality of outlet holes around a periphery of the top bonding framework, wherein the first plurality of outlet holes and the second plurality of outlet holes extend through the top bonding framework substantially perpendicular to the top wafer;
   a bottom wafer on a bottom bonding framework of a bottom platform, the bottom bonding framework including a plurality of inlet holes around a periphery of the bottom bonding framework, wherein the plurality of inlet holes extend through the bottom bonding framework substantially perpendicular to the bottom wafer; and
   a flow control device located in a portion of the first plurality of outlet holes, wherein the flow control device monitors gas flow conditions of a gas stream,
   wherein the top platform is in an overlapping relation to the bottom platform such that a gap exists between the top wafer and the bottom wafer, the gap extending substantially perpendicular to the first plurality of outlet holes, the second plurality of outlet holes, and the plurality of inlet holes.

2. The wafer bonding structure of claim 1, wherein the flow control device closes the portion of the first plurality of outlet holes.

3. The wafer bonding structure of claim 1, wherein the flow control device includes a shutter or plug with a pressure sensor device or flow meter.

4. The wafer bonding structure of claim 1, wherein the bottom bonding framework comprises a bottom bonding chuck positioned above a bottom stage to carry the bottom wafer.

5. The wafer bonding structure of claim 4, wherein the bottom stage moves relative to the bottom bonding framework.

6. The wafer bonding structure of claim 1, wherein the top bonding framework comprises a pin structure located on a central area of the top bonding framework to initiate a contact between the top wafer and the bottom wafer.

7. The wafer bonding structure of claim 1, further comprising:

a pumping device located on the second plurality of outlet holes, wherein the pumping device reduces purging time.

8. The wafer bonding structure of claim 1, further comprising:
a trapping device located on the second plurality of outlet holes, wherein the trapping device prevents back diffusion of moisture to a space between the top wafer and the bottom wafer.

9. A wafer bonding structure, the structure comprising:
a top wafer on a top bonding framework of a top platform, the top bonding framework including a first plurality of outlet holes and a second plurality of outlet holes around a periphery of the top bonding framework, wherein the first plurality of outlet holes and the second plurality of outlet holes extend through the top bonding framework substantially perpendicular to the top wafer;
a bottom wafer on a bottom bonding framework of a bottom platform, the bottom bonding framework including a plurality of inlet holes around a periphery of the bottom bonding framework, wherein the plurality of inlet holes extend through the bottom bonding framework substantially perpendicular to the bottom wafer,
wherein the top bonding framework is in overlapping relation to the bottom bonding framework such that a gap exist between the top wafer and the bottom wafer, the gap extending substantially perpendicular to the first plurality of outlet holes, the second plurality of outlet holes, and the plurality of inlet holes, and wherein the first plurality of outlet holes are blocked so that a gas stream flows across the gap between the top wafer and the bottom wafer.

10. The wafer bonding structure of claim 9, wherein the bottom bonding framework comprises a bottom bonding chuck positioned above a bottom stage to carry the bottom wafer.

11. The wafer bonding structure of claim 10, wherein the bottom stage moves relative to the bottom bonding framework.

12. The wafer bonding structure of claim 9, wherein the top bonding framework comprises a pin structure located on a central area of the top bonding framework to initiate a contact between the top wafer and the bottom wafer.

13. The wafer bonding structure of claim 9, further comprising:
a pumping device located on the second plurality of outlet holes, wherein the pumping device reduces purging time.

14. The wafer bonding structure of claim 9, further comprising:
a trapping device located on the second plurality of outlet holes, wherein the trapping device prevents back diffusion of moisture to a space between the top wafer and the bottom wafer.

* * * * *